Figure 1:
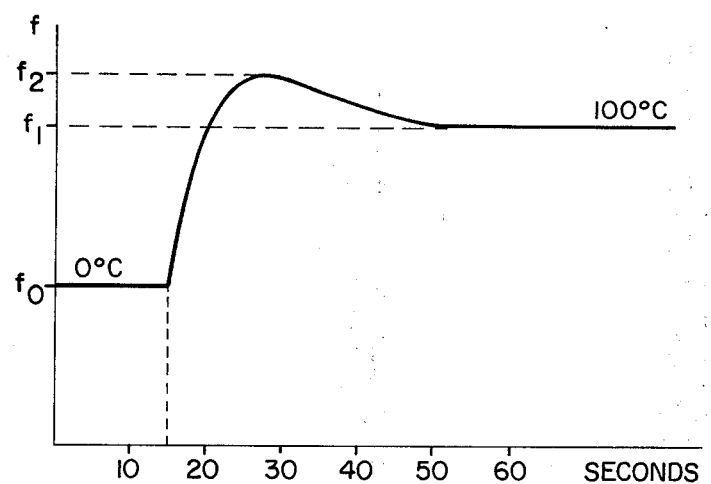

United States Patent [19]

Vig

[11] 4,412,172

[45] Oct. 25, 1983

[54] METHOD OF MEASURING THE THERMAL PROPERTIES OF A RESONATOR

[75] Inventor: John R. Vig, Colts Neck, N.J.

[73] Assignee: The United States of America as represented by the Secretary of the Army, Washington, D.C.

[21] Appl. No.: 315,850

[22] Filed: Oct. 28, 1981

[51] Int. Cl.³ .................... G01R 29/22; G01R 23/00; H04R 17/00

[52] U.S. Cl. ........................................ 324/56; 324/80; 29/25.35

[58] Field of Search ................... 29/25.35; 324/80, 56, 324/58 R, 57 SS

[56] References Cited

U.S. PATENT DOCUMENTS 3,916,303  10/1975  Butuzov ............................ 324/56
4,093,914   6/1978  Peppiatt ......................... 324/80 X

FOREIGN PATENT DOCUMENTS 2648508  4/1977  Fed. Rep. of Germany ........ 324/56

OTHER PUBLICATIONS

Rudolph Bechmann "Frequency-Temperature-Angle Characteristics of AT-Type Resonators Made of Natural and Synthetic Quartz" Proceedings of the ITE, Nov. 1956, pp. 1600-1607.
John A. Kusters "TTC's–Further Developmental Results," Proceedings of the 31st Annual Symposium on Frequency Control, 1977, p. 367.
Hammond, Adams, Benjaminson "Hysteresis Effects in Quartz Resonators" Proceedings of the 22nd Annual Symposium on Frequency Control, 1968, pp. 55 to 66.
Marvin R. Frerking "Vector Voltmeter Crystal Measurement System" Proceedings of the 23rd Annual Symposium on Frequency Control, 1969, pp. 92 to 101.
Ballato and Tilton "Ovenless Activity Dip Tester" Proceedings of the 31st Annual Symposium on Frequency Control, 1977, pp. 102 to 107.

*Primary Examiner*—Stanley T. Krawczewicz
*Assistant Examiner*—Jose M. Solis
*Attorney, Agent, or Firm*—Robert P. Gibson; Jeremiah G. Murray; Roy E. Gordon

[57] ABSTRACT

The thermal properties of a crystal resonator are rapidly and inexpensively measured by first immersing the resonator into an ice water bath at 0° C. and monitoring the frequency of the resonator until the frequency of the resonator is no longer changing; then rapidly immersing the resonator into a boiling water bath at 100° C. and monitoring the frequency versus time characteristic of the resonator at least until the frequency of the resonator is no longer changing; repeating the above cycle, and determining the thermal properties of the crystal resonator from the frequency versus time characteristic.

11 Claims, 2 Drawing Figures

METHOD OF MEASURING THE THERMAL PROPERTIES OF A RESONATOR

The invention described herein may be manufactured, used, and licensed by or for the Government for governmental purposes without the payment to me of any royalty thereon.

This invention relates in general to a method of measuring the thermal properties of a resonator and in particular to a method of rapidly and inexpensively measuring the thermal transient, frequency vs. temperature, and thermal hysteresis characteristics of a quartz crystal resonator.

BACKGROUND OF THE INVENTION

The static frequency vs. temperature characteristic of quartz crystal resonators are discussed by, for example, Rudolph Bechmann in the Proceedings of the IRE, November 1956, at pages 1600 to 1607. Bechmann shows that the frequency vs. temperature of AT-type resonators can be described by the equation $$(f-f_i/f_i) = \Delta f/f = A_i(T-T_i) + C_i(T-T_i)^3 \quad (1)$$

where f is the frequency of the resonator at temperature T, $T_i$ is the inflection temperature, $f_i$ is the frequency at $T_i$ and $\Delta f = f - f_i$. $T_i$, $A_i$ and $C_i$ are constants that are functions of the angles of cut of the resonator. For a particular resonator design, $T_i$ is substantially a constant.

The thermal transient characteristics of resonators are discussed, for example, by John A. Kusters in the Proceedings of the 31st Annual Symposium on Frequency Control, 1977, at pages 3 to 7. Kusters compares the thermal transient characteristics of AT and SC-cut resonators. (Kusters refers to the SC-cut as the "TTC-cut".) He shows that the SC-cut is subject to a substantially smaller thermal transient effect than the AT-cut.

Thermal hysteresis has been discussed, for example by Hammond, Adams and Benjaminson in the Proceedings of the 22nd Annual Symposium on Frequency Control, 1968, at pages 55 to 66.

Heretofore, the measurement of the thermal properties of a resonator have involved time consuming and costly techniques. For example, the static frequency vs. temperature characteristic has been measured by placing the resonator in an oven and varying the temperature of the oven while monitoring the frequency. The thermal transient or warmup characteristic has been measured by placing the resonator into an oven controlled oscillator and monitoring the frequency of the oscillator during warmup. The thermal hystersis has been measured by either placing the resonator into an oscillator, and monitoring the frequency during temperature cycling of the oscillator or by placing the resonator in a $\pi$- network and monitoring the resonator frequency while the resonator -$\pi$ network combination was temperature cycled.

A measurement system that is suitable for measuring both the static frequency vs. temperature and thermal hysteresis characteristics of resonators has been discussed by Marvin E. Frerking in the Proceedings of the 23rd Annual Symposium on Frequency Control, 1969, at pages 92 to 101.

In the past, resonators often exhibited "activity dips" which necessitated a great deal of costly testing. Activity dips, and a method of testing for activity dips using an "ovenless activity dip tester," are discussed by Ballato and Tilton in the Proceedings of the 31st Annual Symposium on Frequency Control, 1977, at pages 102 to 107.

SUMMARY OF THE INVENTION

The general object of the invention is to provide a method of measuring the thermal properties of a resonator. A more particular object of the invention is to provide such a method that is faster, simpler and much less costly than previous methods. A particular object of the invention is to provide a rapid, simple, and economic method of measuring the thermal transient, frequency vs. temperature, and thermal hysteresis characteristics of a resonator.

It has now been found that the aforementioned objects can be attained by a method including the steps of:
(a) immersing the resonator into a first constant temperature bath and monitoring the frequency of the resonator until the frequency of the resonator is no longer changing,
(b) rapidly immersing the resonator into a second constant temperature bath the temperature of which differs from the temperature of the first constant temperature bath, and monitoring the frequency vs. time characteristic of the resonator at least until the frequency of the resonator is no longer changing,
(c) repeating steps (a) and (b) at least once, and
(d) determining the thermal properties of the crystal resonator from the frequency versus time characteristic.

The first constant temperature bath can be an ice bath at 0° C., and the second constant temperature bath can be a boiling water bath at 100° C. The water in both baths should be reasonably pure (e.g. of greater than 1M$\Omega$-cm resistivity), in order to minimize possible effects due to ionic conduction through the water and to define the water temperatures. Of course, the bath temperatures can also be monitored with appropriate thermometers.

The method of the invention is especially useful in measuring the thermal properties of resonators that are substantially free of activity dips such as SC-cut resonators. The method can also be applied to resonators that are subject to activity dips if such resonators are also tested for activity dips, for example, by the ovenless activity dip tester described by Ballato and Tilton. Such testing can be conveniently performed while the resonators are immersed in the constant temperature baths.

DESCRIPTION OF THE DRAWING AND THE PREFERRED EMBODIMENT

Figure 2:
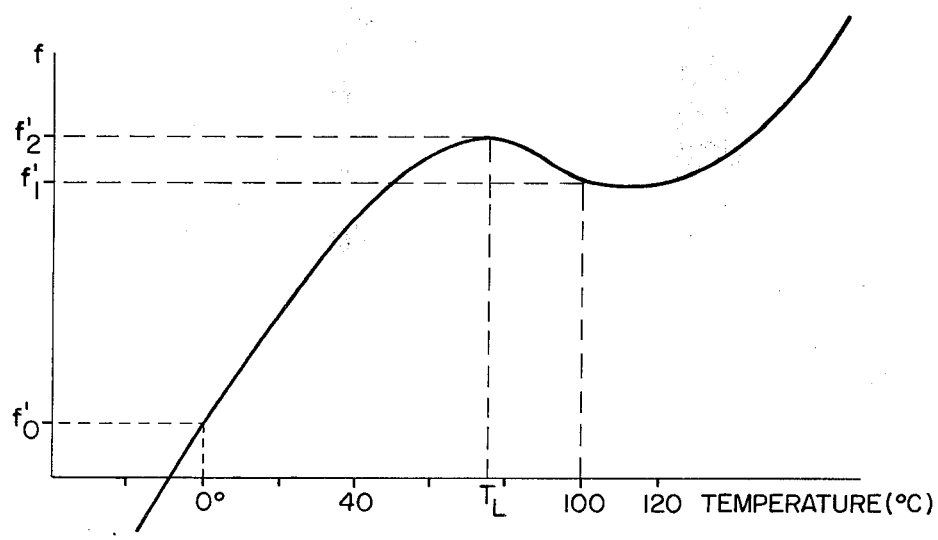

FIG. 1 shows a typical frequency vs. time plot for an SC-cut resonator as it is tested according to the method of the invention. FIG. 2 shows a typical static frequency vs. temperature plot for the same SC-cut resonator.

In FIG. 1, $f_0$ and $f_1$ are the equilibrium frequencies of the resonator at 0° C. (ice bath) and at 100° C. (boiling water bath), respectively. The equilibrium frequency refers to the value obtained after equilibrium is reached, that is, after the frequency of the resonator is no longer changing. At 15 seconds, the resonator is changed rapidly from the ice bath to the boiling water bath and the frequency versus time characteristic is monitored at least until equilibrium is reached at the 100° C. temperature. The result of the measurement obtained by such a monitoring is shown in FIG. 1. The frequency $f_2$ is the turnover frequency, that is, it is the frequency at the point where the frequency vs time curve reverses direction.

In FIG. 2, $f_0'$, $f_1'$, and $f_2'$ have the same meanings as the corresponding quantities in FIG. 1, however, the absolute values may not be the same due to differences in fixturing (e.g., stray reactances). Moreover, $f_2'$ will be different from $f_2$ due to the thermal transient effect. As long as measures are taken to insure that the differences due to fixturing do not change with temperature, $f_1-f_0=f_1'-f_0'$. The temperature that corresponds to $f_2'$ is the lower turnover temperature in the case of SC-cut resonators. In the case of AT-cut resonators, the turnover temperature of interest would be the upper turnover temperature.

The relationships between $(f_1'-f_0'/f_1')$ and $T_L$, and between $(f_1'-f_0'/f_1')$ and $(f_2'-f_1'/f_1')$ are uniquely defined for each resonator design. The relationships can be determined empirically, for example, by preparing a group of resonators of the same design except that the resonator blanks are cut at angles so as to provide a wide range of turnover temperatures. The relationships can then be established from careful measurements of the static frequency vs. temperature characteristics. Once the relationships are defined, the lower turnover temperatures and lower turnover frequencies of subsequent resonators of the same design can be readily determined from measuring $f_1$ and $f_0$ for each resonator (since $(f_1-f_0/f_1)=(f_1'-f_0'/f_1')$). For a group of SC-cut resonators, for example, $T_L$ ranged from $+95°$ C. to $-11°$ C.; $f_1'-f_0'/f_1'$ ranged from $-60$ ppm at $95°$ C., to $+5$ ppm at $48°$ C., to $+153$ ppm at $-11°$ C. Similarly, $f_2'-f_1'/f_1'$ ranged from 0.1 ppm at $95°$ C., to 26 ppm at $48°$ C., to 129 ppm at $-11°$ C.

In this method, the thermal properties of a resonator are determined as follows:

I. The turnover temperatures and frequencies of the static frequency vs. temperature characteristic are calculated from the measured values of $f_1$ and $f_0$, as described above.

II. The thermal transient effect (or warmup) is characterized by $(f_2-f_1)-(f_2'-f_1')$. The thermal time constant of resonators that exhibit a small thermal transient effect, e.g. of SC-cut resonators, is the time for the resonator frequency to reach its value at $63.2°$ C. after immersion into the $100°$ C. bath.

III. Differences among the values of $f_0$ and among the values of $f_1$ that are obtained upon repeating the test can be measures of the resonators' thermal hysteresis.

One convenient method of screening large numbers of resonators is to cycle each resonator five times between the $0°$ C. and $100°$ C. baths, with dwell times of, for example, 90 seconds in each bath during each cycle. One thus obtains five sets of measurements of $f_0$ and $f_1$ for each resonator, in approximately 15 minutes. The differences between the maximum and minimum values of $f_0$ and the maximum and minimum values of $f_1$ can be defined as the thermal hysteresis at $0°$ C. and $100°$ C. respectively. Of course, the number of cycles, the dwell times, and the temperatures of the constant temperature baths can be adjusted in order to obtain the most useful results for a given resonator design.

To obtain high accuracy, atmospheric pressure should be monitored and the temperatures of the baths should be corrected for atmospheric pressure, or alternatively, an accurate thermometer should be used to monitor the temperatures. A particularly accurate and useful thermometer for doubly rotated resonators is the b-mode of such resonators. Care must be taken to minimize reactance changes as the resonator is changed from one bath to the other, and to minimize variations in the time that the resonator spends in transit between the baths.

For example, to minimize reactance variations during the test, the resonator and the leads can be held rigidly and instead of moving the resonator, the baths can be moved. To minimize spills and evaporation, the baths can be covered with lids that have openings just large enough to permit the resonators to pass through. The resonator frequencies can be monitored with high precision by using a bridge-type or transmission-type measurement system.

The above described test can be particularly useful for production-line testing of SC-cut resonators because:

1. properly designed SC-cut resonators are substantially free of activity dips, 2. SC-cut resonators are thermal transient compensated and have flatter f vs. T characteristics than comparable AT-cut crystals, and 3. the b-mode is available for thermometry.

The method can also be applied to any other type of resonators, particularly if the resonators are also screened for activity dips. Additional types of resonators for which this method is useful include: AT-cut, BT-cut, GT-cut, FC-cut, IT-cut, and surface acoustic wave resonators.

Using only two constant temperature baths, as for example, the boiling water and ice baths, can be sufficient for the production line screening of large numbers of resonators of the same design. If a higher measurement precision is desired, then one or more additional constant temperature baths may be used.

EXAMPLE 1

A fundamental mode SC-cut resonator is tested by the above described method. The frequency at $0°$ C. in the ice bath is 5,114,594 Hz. The frequency in the boiling water bath is 5,114,888 Hz. The time it takes to transfer the resonator from the ice bath to the boiling water bath is less than one second. The frequency overshoot (i.e., the thermal transient effect) is 2.3 Hz during the experiment. The frequency is within 0.2 ppm (1 Hz) of the final equilibrium frequency after 24 seconds. The precise resonator temperature in each bath is determined from the b-mode frequency.

The time for reaching the frequency at $63.2°$ C., i.e., the thermal time constant of this resonator, is 7 seconds. When the resonator is immersed in the $0°$ C. ice bath a second time, the frequency is 5,114,596, i.e., the resonator exhibits thermal hysteresis of 2 Hz at $0°$ C. After cycling the resonator five times between the $0°$ C. and $100°$ C. baths, a worst case hysteresis of 3.1 Hz at $0°$ C. and 0.1 Hz at $100°$ C. is observed.

From the $0°$ C. and the $100°$ C. equilibrium frequencies of this resonator, it is determined that the lower turnover temperature of the resonator is $97°$ C.

EXAMPLE 2

The same method is carried out using a fundamental mode AT-cut resonator for testing. When tested at $0°$ C. and $100°$ C. by the "ovenless activity dip tester" described by Ballato and Tilton, this resonator is found not to exhibit activity dips. The frequency in the ice bath is 5,115,294 Hz; the frequency in the $100°$ C. bath is 5,114,710 Hz. After 5 seconds, the frequency undershoot that is typical of AT-cut resonators reaches the maximum value of 405 Hz. The frequency that is 0.2 ppm (1 Hz) of the final equilibrium frequency at 100° C. is reached after 47 seconds. From the equilibrium 0° and 100° C. frequencies, it is determined that the upper turnover point of this resonator is at 102° C. When the resonator is immersed in the 0° bath a second time, the equilibrium frequency is 5,115,289 Hz, that is, the resonator exhibits a hysteresis of 5 Hz at 0° C. After cycling this resonator five times between the 0° C. and 100° C. baths, a worst case hysteresis of 8.7 Hz at 0° C. and 0.8 Hz at 100° C. is observed.

I wish it to be understood that I do not desire to be limited to the exact details as described for obvious modifications will occur to a person skilled in the art.

What is claimed is:

1. Method of rapidly and inexpensively measuring the thermal properties of a crystal resonator that is substantially free of activity dips, said method including the steps of:
   (a) immersing the resonator into a constant temperature ice bath at 0° C. and maintaining the frequency of the resonator until the frequency of the resonator is no longer changing,
   (b) rapidly immersing the resonator into a constant temperature boiling water bath at 100° C. and monitoring the frequency versus time characteristic of the resonator at least until the frequency of the resonator is no longer changing,
   (c) repeating steps (a) and (b) at least once, and
   (d) determining the thermal properties of the crystal resonator from the frequency versus time characteristics wherein the thermal transient effect is characterized by $(f_2-f_1)-(f_2'-f_1')$ where $(f_2'-f_1')$ can be determined from $(f_1-f_0)$ and wherein $f_2$ is the turnover frequency of the frequency versus time curve, $f_1$ is the frequency obtained from the frequency versus time characteristic at 100° C. when the frequency of the resonator is no longer changing, $f_0$ is the frequency obtained from the frequency versus time characteristic at 0° C. when the frequency of the resonator is no longer changing and wherein $f_2'$ is the turnover frequency obtained from the static frequency versus temperature characteristic and wherein $f_1'$ is the frequency obtained from the static frequency versus temperature characteristic at 100° C.

2. Method according to claim 1 wherein between steps (b) and (c) the resonator is rapidly immersed into a third constant temperature bath and the resonator frequency vs. time characteristic is monitored at least until the frequency of the resonator is no longer changing.

3. Method according to claim 1 wherein the resonator is also tested for activity dips.

4. Method of rapidly and inexpensively measuring the thermal properties of a crystal resonator that is substantially free of activity dips, said method including the steps of:
   (a) immersing the resonator into a constant temperature ice bath at 0° C. and monitoring the frequency of the resonator until the frequency of the resonator is no longer changing,
   (b) rapidly immersing the resonator into a constant temperature boiling water bath at 100° C. and monitoring the frequency versus time characteristic of the resonator at least until the frequency of the resonator is no longer changing,
   (c) repeating steps (a) and (b) at least once, and
   (d) determining the thermal properties of the crystal resonator from the frequency versus time characteristics wherein the lower turnover temperature $T_L$ is determined from $f_1$ and $f_0$ wherein $f_1$ is the frequency obtained from the frequency versus time characteristic at 100° C. when the frequency of the resonator is no longer changing, and wherein $f_0$ is the frequency obtained from the frequency versus time characteristic at 0° C. when the frequency of the resonator is no longer changing.

5. Method of rapidly and inexpensively measuring the thermal properties of a crystal resonator that is substantially free of activity dips, said method including the steps of:
   (a) immersing the resonator into a constant temperature ice bath at 0° C. and monitoring the frequency of the resonator until the frequency of the resonator is no longer changing,
   (b) rapidly immersing the resonator into a constant temperature boiling water bath at 100° C. and monitoring the frequency versus time characteristic of the resonator at least until the frequency of the resonator is no longer changing,
   (c) repeating steps (a) and (b) at least once, and
   (d) determining the thermal properties of the crystal resonator from the frequency versus time characteristics wherein the thermal hysteresis is measured by the differences among the values of $f_0$ and among the values of $f_1$ that are obtained upon repeating the test wherein $f_0$ is the frequency obtained from the frequency versus time characteristic at 0° C. when the frequency of the resonator is no longer changing and wherein $f_1$ is the frequency obtained from the frequency versus time characteristic at 100° C. when the frequency of the resonator is no longer changing.

6. Method of rapidly and inexpensively measuring the thermal properties of a crystal resonator that is substantially free of activity dips, said method including the steps of:
   (a) immersing the resonator into a constant temperature ice bath at 0° C. and monitoring the frequency versus time characteristic of the resonator at least until the frequency of the resonator is no longer changing,
   (b) rapidly immersing the resonator into a constant temperature boiling water bath at 100° C. and monitoring the frequency versus time characteristic of the resonator at least until the frequency of the resonator is no longer changing,
   (c) repeating steps (a) and (b) at least once, and
   (d) determining the thermal properties of the crystal resonator from the frequency versus time characteristics wherein the water in both baths has a resistivity of greater than 1 megohm centimeter.

7. Method of rapidly and inexpensively measuring the thermal properties of a crystal resonator that is substantially free of activity dips said method including the steps of:
   (a) immersing the resonator into a constant temperature ice bath at 0° C. and monitoring the frequency of the resonator until the frequency of the resonator is no longer changing,
   (b) rapidly immersing the resonator into a constant temperature boiling water bath at 100° C. and monitoring the frequency versus time characteristics of the resonator at least until the frequency of the resonator is no longer changing, (c) repeating steps (a) and (b) at least once, and (d) determining the thermal properties of the crystal resonator from the frequency versus time characteristics and wherein the bath temperatures are monitored with appropriate thermometers.

8. Method of rapidly and inexpensively measuring the thermal properties of a crystal resonator that is substantially free of activity dips, said method including the steps of:

(a) immersing the resonator into a constant temperature ice bath at 0° C. and monitoring the frequency of the resonator until the frequency of the resonator is no longer changing, (b) rapidly immersing the resonator into a constant temperature boiling water bath at 100° C. and monitoring the frequency versus time characteristic of the resonator at least until the frequency of the resonator is no longer changing, (c) repeating steps (a) and (b) at least once, and (d) determining the thermal properties of the crystal resonator from the frequency versus time characteristics and wherein to minimize resistance variations during the test, the resonator and leads are held rigidly and instead of moving the resonator, the baths are moved.

9. Method of rapidly and inexpensively measuring the thermal properties of an SC-cut crystal resonator that is substantially free of activity dips, said method including the steps of:

(a) immersing the SC-cut crystal resonator into a constant temperature ice bath at 0° C. and monitoring the frequency of the resonator until the frequency of the resonator is no longer changing, (b) rapidly immersing the SC-cut crystal resonator into a constant temperature boiling water bath at 100° C. and monitoring the frequency versus time characteristic of the resonator at least until the frequency of the resonator is no longer changing, (c) repeating steps (a) and (b) at least once, and (d) determining the thermal properties of the SC-cut crystal resonator from the frequency versus time characteristics and wherein to minimize spills and evaporation the baths are covered with lids that have openings just large enough to permit the resonators to pass through.

10. Method of rapidly and inexpensively measuring the thermal properties of an SC-cut crystal resonator that is substantially free of activity dips, said method including the steps of:

(a) immersing the SC-cut crystal resonator into a constant temperature ice bath at 0° C. and monitoring the frequency of the resonator until the frequency of the resonator is no longer changing, (b) rapidly immersing the SC-cut crystal resonator into a constant temperature boiling water bath at 100° C. and monitoring the frequency versus time characteristic of the resonator at least until the frequency of the resonator is no longer changing, (c) repeating steps (a) and (b) at least once, and (d) determining the thermal properties of the SC-cut crystal resonator, from the frequency versus time characteristics and wherein the thermal time constant of the SC-cut resonator is characterized by the time that it takes for the resonator frequency to reach the value it has at 63.2° C. after immersion into the 100° C. bath.

11. Method of rapidly and inexpensively measuring the thermal properties of an SC-cut crystal resonator that is substantially free of activity dips, said method including the steps of:

(a) immersing the SC-cut crystal resonator into a constant temperature ice bath at 0° C. and monitoring the frequency of the resonator until the frequency of the resonator is no longer changing, (b) rapidly immersing the SC-cut crystal resonator into a constant temperature boiling water bath at 100° C. and monitoring the frequency versus time characteristic of the resonator at least until the frequency of the resonator is no longer changing, (c) repeating steps (a) and (b) at least once, and (d) determining the thermal properties of the SC-cut crystal resonator from the frequency versus time characteristics and wherein the b-mode frequency is used to determine the resonator's temperature.

* * * * *